(12) United States Patent
Campbell et al.

(10) Patent No.: US 7,202,678 B2
(45) Date of Patent: Apr. 10, 2007

(54) RESISTIVE PROBE TIPS

(75) Inventors: Julie A. Campbell, Beaverton, OR (US); Lawrence W. Jacobs, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 96 days.

(21) Appl. No.: 11/018,133

(22) Filed: Dec. 17, 2004

(65) Prior Publication Data

US 2005/0134298 A1 Jun. 23, 2005

Related U.S. Application Data

(60) Provisional application No. 60/531,076, filed on Dec. 18, 2003.

(51) Int. Cl.
*G01R 31/02* (2006.01)
(52) U.S. Cl. ...................................... 324/754
(58) Field of Classification Search ............... None
See application file for complete search history.

(56) References Cited

U.S. PATENT DOCUMENTS

| | | | | |
|---|---|---|---|---|
| 3,992,073 A * | 11/1976 | Buchoff et al. | ............... | 439/86 |
| 4,189,203 A | 2/1980 | Miller | | |
| 4,450,314 A * | 5/1984 | Huther | ............... | 136/230 |
| 5,139,862 A | 8/1992 | Swift et al. | | |
| 5,177,439 A * | 1/1993 | Liu et al. | ............... | 324/754 |
| 5,291,129 A * | 3/1994 | Kazama | ............... | 324/757 |
| 5,508,627 A * | 4/1996 | Patterson | ............... | 324/752 |
| 5,530,375 A * | 6/1996 | Seidel | ............... | 324/761 |
| 5,606,263 A * | 2/1997 | Yoshizawa et al. | ............... | 324/761 |
| 5,701,666 A * | 12/1997 | DeHaven et al. | ............... | 29/831 |
| 5,864,946 A | 2/1999 | Eldridge et al. | | |
| 6,214,921 B1 | 4/2001 | Bluett et al. | | |
| 6,529,024 B2 * | 3/2003 | Noda | ............... | 324/754 |
| 6,535,003 B2 * | 3/2003 | Aldaz et al. | ............... | 324/754 |
| 6,741,221 B2 | 5/2004 | Aisenbrey | | |
| 6,870,516 B2 | 3/2005 | Aisenbrey | | |
| 7,006,046 B2 | 2/2006 | Aisenbrey | | |
| 2006/0119522 A1 | 6/2006 | Aisenbrey | | |
| 2006/0119523 A1 | 6/2006 | Aisenbrey | | |

OTHER PUBLICATIONS

Thomas Aisenbrey, Low-Cost Antennas Using Conductive Plastics, U.S. Appl. No. 60/268,822, filed Feb. 15, 2001, 4 pages, U.S. Patent and Trademark Office, U.S.

(Continued)

*Primary Examiner*—Ha Tran Nguyen
*Assistant Examiner*—Richard Isla-Rodas
(74) *Attorney, Agent, or Firm*—Law Office of Karen Dana Oster, LLC

(57) ABSTRACT

A test probe tip constructed substantially from resistive material. The resistive material is made of resistive conducting material substantially enclosed in and dispersed throughout encapsulating material. The test probe has a probing end for probing electronic circuitry and a connection end for interfacing with a probing head. The resistive conducting material forms at least one path through the encapsulating material from the probing end to the connection end. The resistive conducting material may be a plurality of longitudinally extending resistive/conductive members or a plurality of particulate resistive/conductive members.

29 Claims, 5 Drawing Sheets

OTHER PUBLICATIONS

Thomas Aisenbrey, Low-Cost Antennas Using Conductive Plastics, U.S. Appl. No. 60/269,414, filed Feb. 16, 2001, 8 pages, U.S. Patent and Trademark Office, U.S.

Thomas Aisenbrey, Low Cost Antennas Implemented With Composites Of Conductive Powders, Fibers, Or Concentrates, U.S. Appl. No. 60/317,808, filed Sep. 7, 2001, 10 pages, U.S. Patent and Trademark Office, U.S.

Thomas Aisenbrey, Low Cost Electronic Probe Using Conductive Plastics Or Conductive Composites, U.S. Appl. No. 60/478,776, filed Jun. 16, 2003, 15 pages, U.S. Patent and Trademark Office, U.S.

Stat-Kon* DCL-4413 SM Data Sheet, LNP Engineering Plastics Inc., at least as early as Jun. 8, 2005, 2 pages.

Stat-Kon* EC-1005 Data Sheet, LNP Engineering Plastics Inc., at least as early as Jun. 8, 2005, 2 pages.

Stat-Kon* EC-1005 SM Data Sheet, LNP Engineering Plastics Inc., at least as early as Jun. 8, 2005, 2 pages.

Electrafil General Information on Application and Properties, DSM Engineering Plastics Inc., at least as early as Aug. 24, 2006. 15 pages.

* cited by examiner

FIG. 9
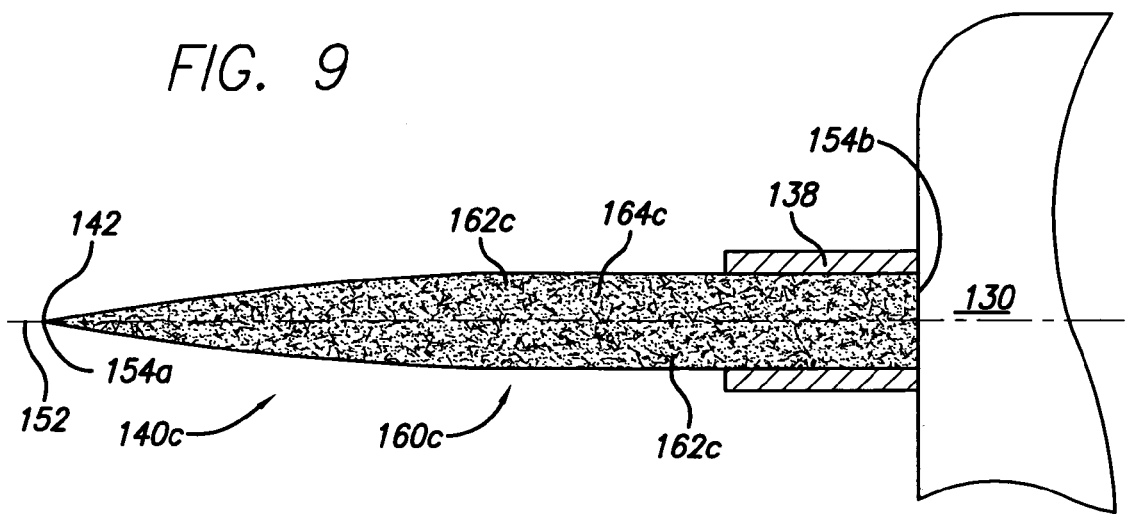
FIG. 10
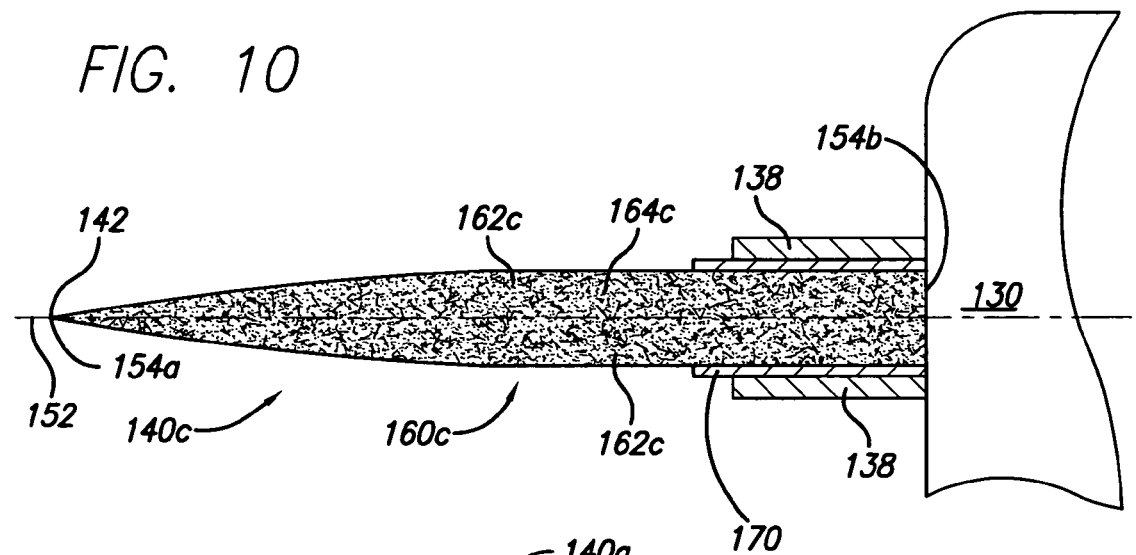
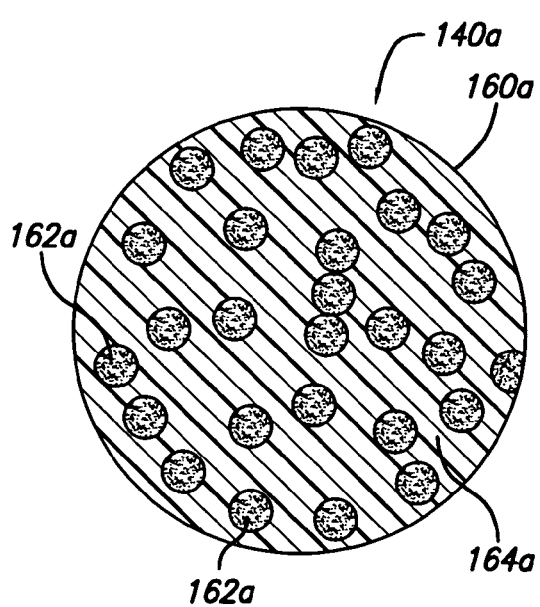
FIG. 11

FIG. 12
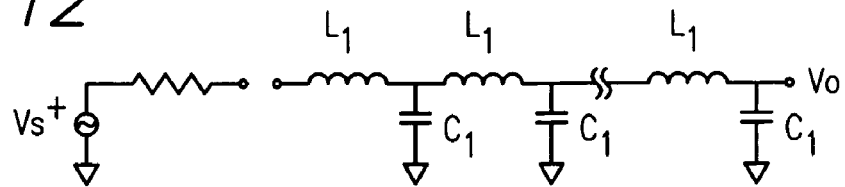
FIG. 13
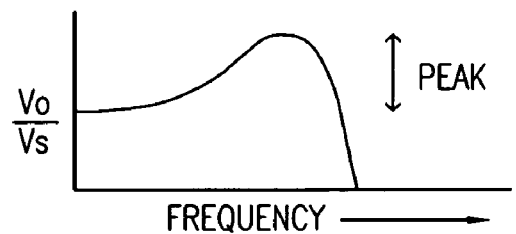
FIG. 14
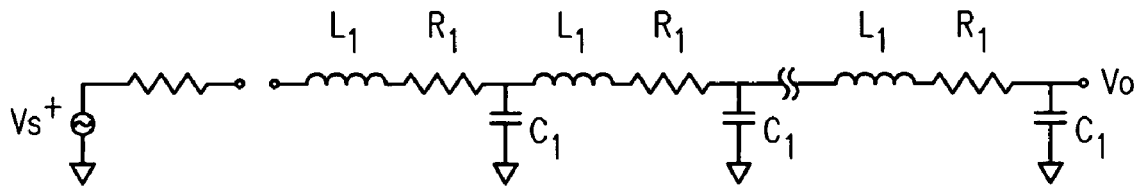
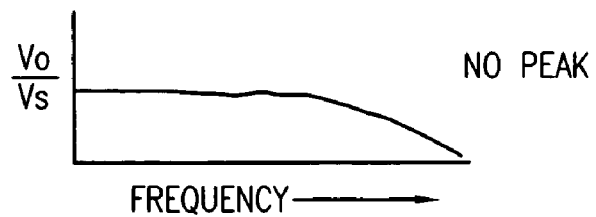
FIG. 15

RESISTIVE PROBE TIPS

The present application is an application claiming the benefit under 35 USC Section 119(e) of U.S. Provisional Patent Application Ser. No. 60/531,076 filed Dec. 18, 2003. The present application is based on and claims priority from this application, the disclosure of which is hereby expressly incorporated herein by reference in its entirety.

BACKGROUND OF INVENTION

The present invention is directed to electrical test probe tips and, more particularly to resistive test probe tips.

Electrical test probes are used to provide an electrical connection between electrical components and testing instruments such as oscilloscopes and other measuring, monitoring, diagnostic, and signal processing instruments. An electrical test probe generally consists of a probing head, a cable, and a testing instrument connector. The probing head may have an integral or replaceable electrical test probe tip that is suitable for making an electrical contact with electrical components. The testing instrument connector is suitable for connecting to a testing instrument. The probing head is attached to a first end of the cable and the testing instrument connector is attached to the opposite end of the cable. The probe head circuitry represented in FIGS. 2, 3, and 6 are meant to be broad generalizations of probe heads. It is recognized that probe heads in general may have some parasitic capacitance and inductance.

A perfect test probe tip would have a frequency response in which the voltage in was equal to the voltage out. As shown in FIG. 1, this frequency response would be perfectly flat, like trace A.

Traditional test probe tips 30 are generally a single piece of metal that may or may not have a shaped probing end or point of contact 32. The form (e.g. the pointed tip) and strength of these traditional test probe tips 30 make them extremely useful for probing electrical components. As shown in FIG. 2, these traditional test probe tips 30 have some inherent inductance 34 and at least some stray capacitance 36 between the point of contact 32 and ground 38. A traditional metal test probe tip has a frequency response such as trace B (FIG. 1). This frequency response tends to have a relatively high peak, but then falls off sharply.

The evolution of electronic circuitry and higher bandwidth signals necessitated new probe tips with frequency responses closer to the perfect frequency response. As shown in FIG. 3, to counteract the resonance between the inductance 34 of the tip 30 and the stray capacitance 36, it has been known to add a resistor 40 (which may have leads) just before the point of contact 32. A test probe tip with an added resistor has a frequency response such as trace C (FIG. 1). This frequency response does not have the relatively high initial peak associated with traditional metal probe tips. Adding the resistor 40 and leads (leaded resistor 40) is problematic because it adds unwanted length to the tip 30. In use, this type of probe tip usually must be soldered into place, as its leads are too soft for a browsing (quick touch) type of probing of electrical components. To use this type of probe tip for quick touch browsing the probe tip would have to have reinforcement that would add parasitic capacitance.

When a capacitor (or low pass filter) is added between differential probe tips or a capacitor is added between the single ended probe tip and ground, the effect is to "roll off" the frequency response. As shown in trace D of FIG. 1, although this would bring down the peak of the frequency response, it would also reduce the bandwidth performance of the tip.

Extrusion and pultrusion are manufacturing methods. Using extrusion, material (e.g. plastic, composites, resins, or metals) is pressurized and forced (pushed) through an opening of a particular shape. Using extrusion, the finished product will be larger than the die opening due to the pressure flowing through the die. Using pultrusion, material is "pulled" or drawn through an opening of a particular shape. Using pultrusion, the finished product will be smaller than the die opening due to the pulling (stretching) of the material. Pultruded products tend to be stronger than extruded products. As an example of pultrusion, fibers (e.g. fiberglass) may be impregnated with liquid resin, carefully formed, and pulled through a heated die by powerful equipment. A fully cured and solid composite profile exits the die. The resulting product may be cut, shaped, and/or machined.

As a manufacturing process, pultrusion has many advantages including ease of automation and cost-effectiveness. Pultruded products also have many advantages. For example, all pultruded profiles have continuous cross section, but they can have a variety of shapes, sizes, colors, fabrication options, and protective finishes. Pultruded products can be tailored to provide high performance and cost advantages over materials such as metals, wood, and extruded thermoplastics. As compared to metals, pultruded composites offer weight reduction, thermal insulation, superior corrosion and chemical resistance, greater strength, and reduced expansion and contraction with temperature (CTE).

U.S. Pat. No. 5,139,862 to Swift et al. (the "Swift reference"), the disclosure of which is incorporated herein by reference, is directed to an electronic device for conducting electric current that has two contacting components at least one of which is a nonmetallic electronic contact in the form of a pultruded composite member made of a plurality of small generally circular cross section conductive fibers in a polymer matrix. The fibers are oriented in the matrix in a direction substantially parallel to the axial direction of the pultruded composite member and are continuous from one end of the member to the other to provide a plurality of electrical contact points at each end of the member.

BRIEF SUMMARY OF THE INVENTION

The present invention is directed to a test probe tip constructed substantially from resistive material. The resistive material is made of resistive conducting material substantially enclosed in and dispersed throughout encapsulating material. The test probe has a probing end for probing electronic circuitry and a connection end for interfacing with a probing head. The resistive conducting material forms at least one path through the encapsulating material from the probing end to the connection end. The resistive conducting material may be a plurality of longitudinally extending resistive/conductive members or a plurality of particulate resistive/conductive members.

A probe tip of the present invention has substantially flat frequency response without a loss of bandwidth. Further, probe tips made from the resistive material may be used as "touch and browse" probing tips.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 9 is a cross sectional top view of a third exemplary resistive test probe tip of the present invention in a connection mechanism of a probing head, the resistive test probe tip having particulate resistive/conductive members dispersed within encapsulating material.

FIG. 10 is a cross sectional top view of the resistive test probe tip of FIG. 9 that is at least partially coated.

FIG. 11 is a cross sectional view of the resistive test probe tip of FIG. 7 taken along line 11'—11'.

FIG. 12 is a circuit diagram of a prior art traditional metal probe tip modeled as a distributed circuit or transmission line with inductance and capacitance per unit length.

FIG. 13 is a frequency response chart of the circuit shown in FIG. 12.

FIG. 14 is a circuit diagram of a probe tip made of resistive material.

FIG. 15 is a frequency response chart of the circuit shown in FIG. 14.

DETAILED DESCRIPTION OF THE INVENTION

Figure 1:
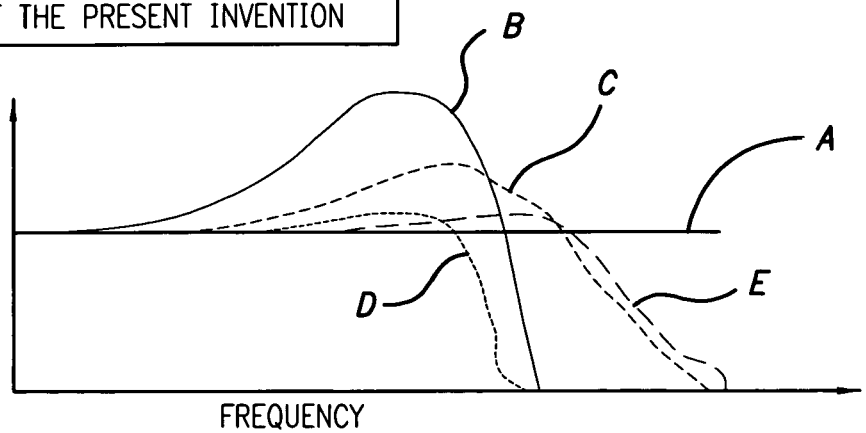
FIG. 1 is a frequency response chart showing the difference in frequency responses of a perfect test probe tip (A), a traditional test probe tip (B), a test probe tip with added resistor (C), a test probe tip with added capacitor (D), and the test probe tip of the present invention (E).
Figure 2:
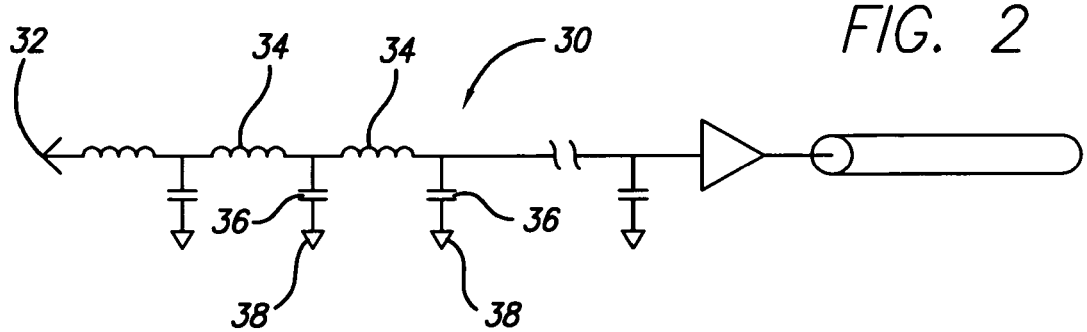
FIG. 2 is a circuit diagram of a prior art traditional metal probe tip.
Figure 3:
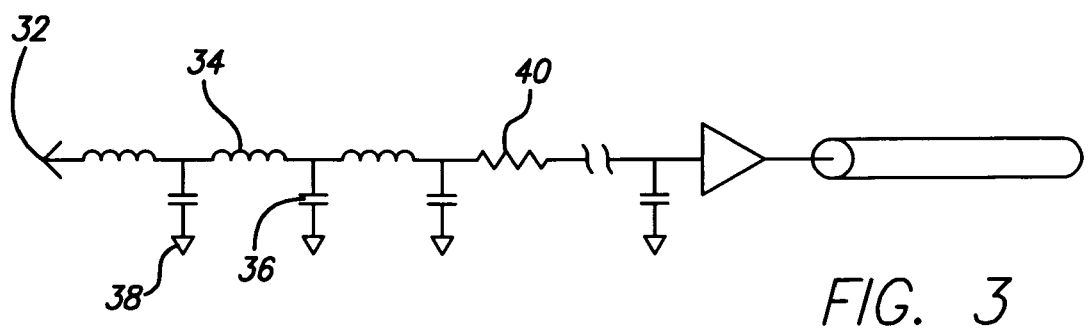
FIG. 3 is a circuit diagram of a prior art probe tip having an added resistor just before the point of contact.

The present invention is a resistive test probe tip in which the entire tip (or substantially the entire tip) is a resistor. In one preferred embodiment, the tip is made from resistive material. As can be seen in FIG. 1, the present invention has a frequency response such as trace E that is a significant improvement over the frequency response (trace B) of a traditional metal test probe tip (FIG. 2) and to frequency responses (trace D) of test probe tips with at least one added capacitor. The frequency response (trace E) of the present invention is similar (and preferably slightly improved) to frequency responses (trace C) of test probe tips with at least one added resistor (FIG. 3). Because the entire extension is resistive, the resistive test probe tip of the present invention may be a long probing tip without the problems associated with length and the increased inductance usually associated with length. In addition, because of the strength of the probing tips of the present invention, they may still be useful as "touch and browse" probing tips.

The present invention can be seen as a dramatic step forward in the evolution of testing probes. Although prior art test probe tips such as those shown in FIG. 3 recognized the advantages of resistance, traditional material that would be thought of as resistive (e.g. carbon, nichrome, graphite) is brittle and would not be useable for probing. It would also be difficult or impossible to form these traditional materials into specific probe tip shapes. It is only with the relatively new development of resistive composite materials that the present invention could have been made.

Figure 4:
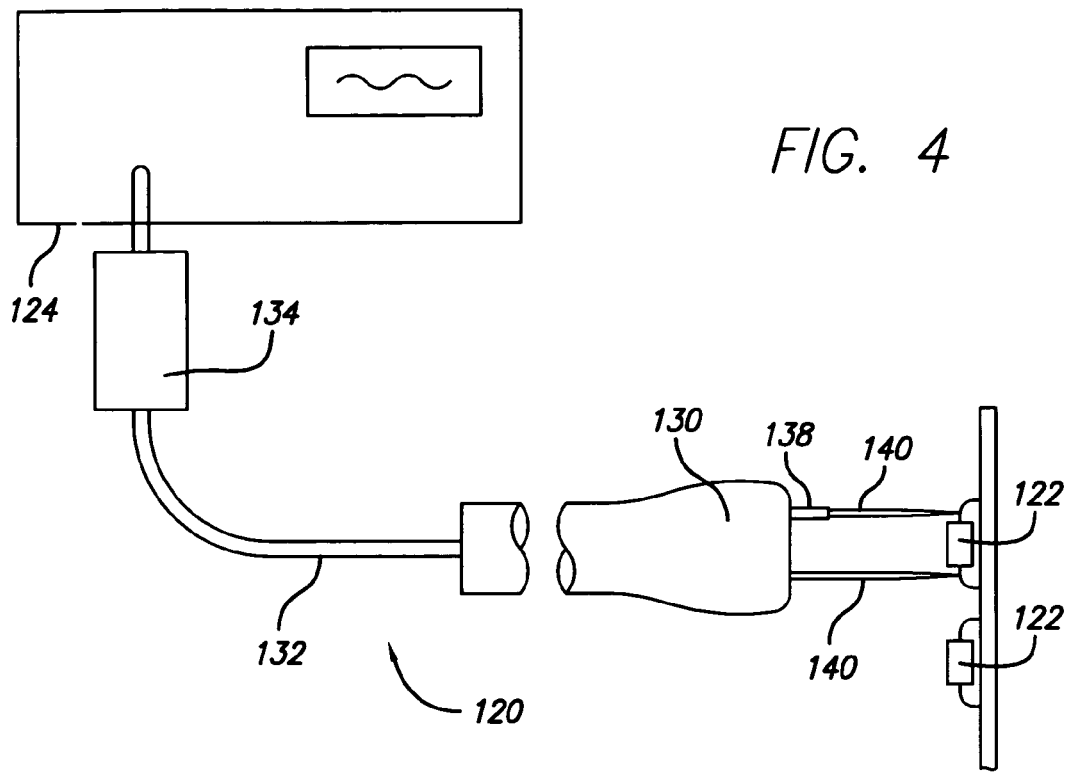
FIG. 4 is a schematic diagram of a first exemplary probing system in which the test probe tip of the present invention may be used.
Figure 5:
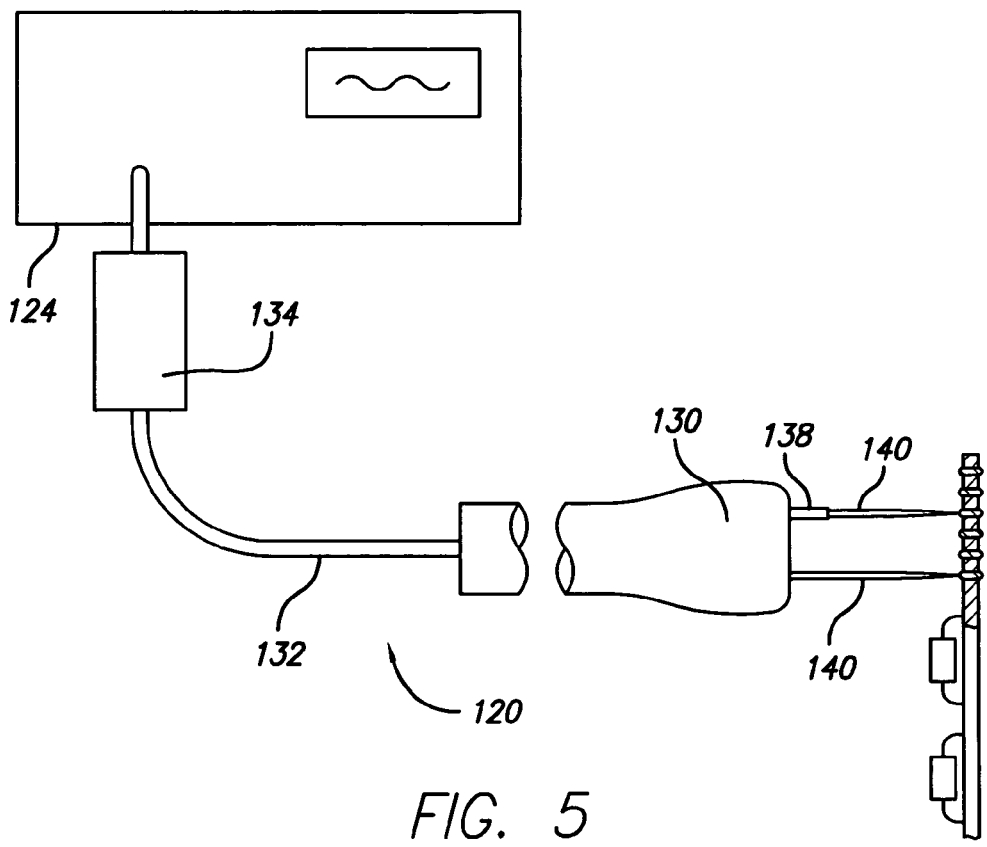
FIG. 5 is a schematic diagram of a second exemplary probing system in which the test probe tip of the present invention may be used.

As shown in FIGS. 4 and 5, the present invention may be implemented as part of a probing system that includes an electrical test probe 120 for providing an electrical connection between electrical components 122 and testing instruments 124. An electrical test probe 120 generally consists of a probing head 130, a cable 132, and a testing instrument connector 134. The probing head 130 may have an integral or replaceable probe tip 140 that is suitable for making electrical contact with electrical components 122. The testing instrument connector 134 is suitable for connecting to a testing instrument 124. If the probe tip 140 is replaceable, generally the probing head 130 will have a socket 138 or other connection mechanism for mating with the probe tip 140. In one alternative embodiment, the probe tip may be conductively glued or soldered to the transmission path of the probing head 130. The probing head 130 is attached to a first end of the cable 132 and the testing instrument connector 134 is attached to the opposite end of the cable 132.

Figure 6:
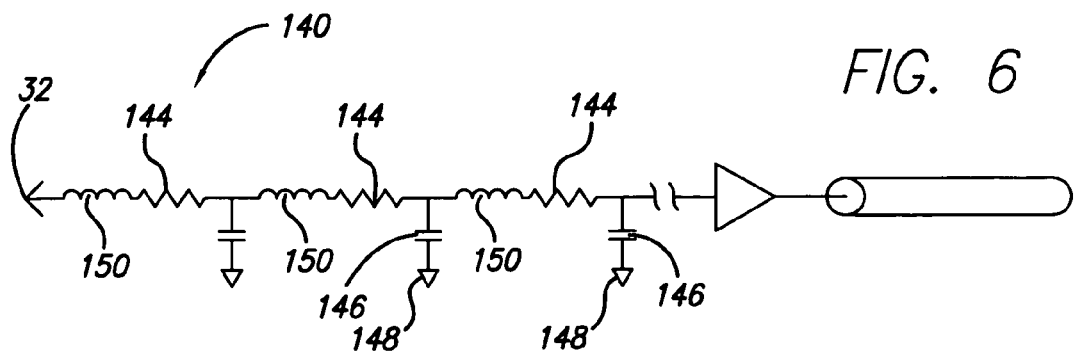
FIG. 6 is a circuit diagram of a probe tip of an exemplary embodiment of the present invention.

FIGS. 6–11 show different views of exemplary embodiments of the probe tip 140 of the present invention. FIG. 6 shows an exemplary circuit diagram of the probe tip 140. FIGS. 7–10 show exemplary longitudinal cross sectional views of alternative embodiments of the present invention. FIG. 11 shows an exemplary cross sectional view of the embodiment shown in FIG. 7.

This probe tip 140 is constructed substantially of resistive material that preferably has a shaped probing end or point of contact 32. As with traditional probe tips, the probe tip 140 has some inherent inductance 144 and at least some stray capacitance 146 between the point of contact 32 and ground 148. However, the resistive material 160, from which the probe tip 140 of the present invention is constructed, has inherent resistance 150 that counteracts the resonance between the inductance 144 of the tip 140 and the stray capacitance 146. This can be done without adding length to the tip 140 because the probe tip 140 of the present invention has resistive characteristics.

FIGS. 7–11 show exemplary mechanical embodiments of the resistive test probe tip 140a (FIG. 7), 140b (FIG. 8), or 140c (FIG. 9) (that will be discussed generally as probe tip 140) of the present invention. Each of these embodiments is made of resistive material 160a (FIG. 7), 160b (FIG. 8), or 160c (FIG. 9) (that will be discussed collectively as resistive material 160). The resistive material includes at least one resistive/conductive member 162a (FIG. 7), 162b (FIG. 8), or 162c (FIG. 9) (that will be discussed collectively as resistive/conductive member 162) that is surrounded by encapsulating material 164a (FIG. 7), 164b (FIG. 8), or 164c (FIG. 9) (that will be discussed generally as encapsulating material 164). The resistive material 160, for purposes of this invention, includes at least one resistive/conductive member 162 substantially enclosed in encapsulating material 164. It should be noted that in at least one preferred embodiment, the encapsulating material 164 is nonconductive. The exemplary probe tips 140 preferably have a longitudinal axis 152, a probing end 154a for probing electronic circuitry 122, and a connection end 154b for interfacing with a probing head 130.

Figure 7:
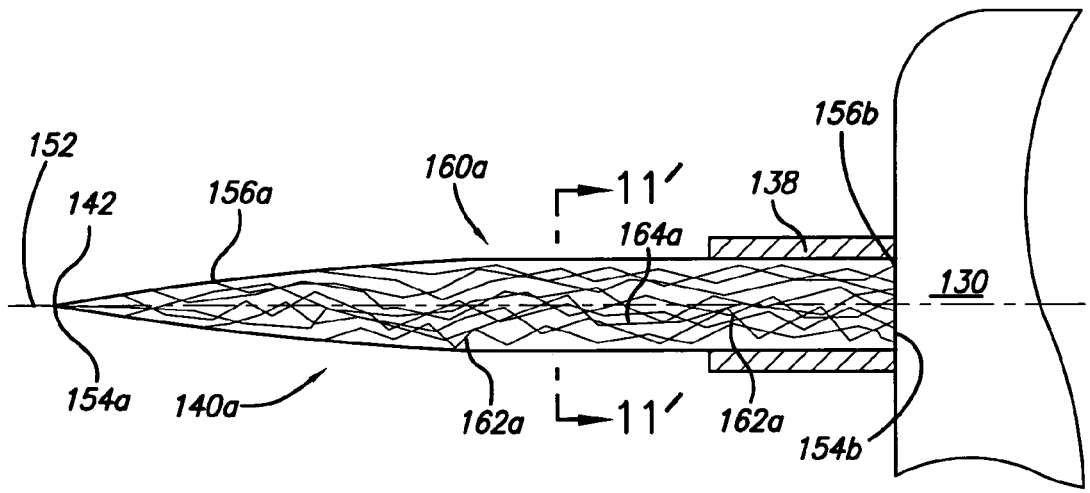
FIG. 7 is a cross sectional top view of a first exemplary resistive test probe tip of the present invention in a connection mechanism of a probing head, the resistive test probe tip having longitudinal resistive/conductive members dispersed unevenly within encapsulating material.
Figure 8:
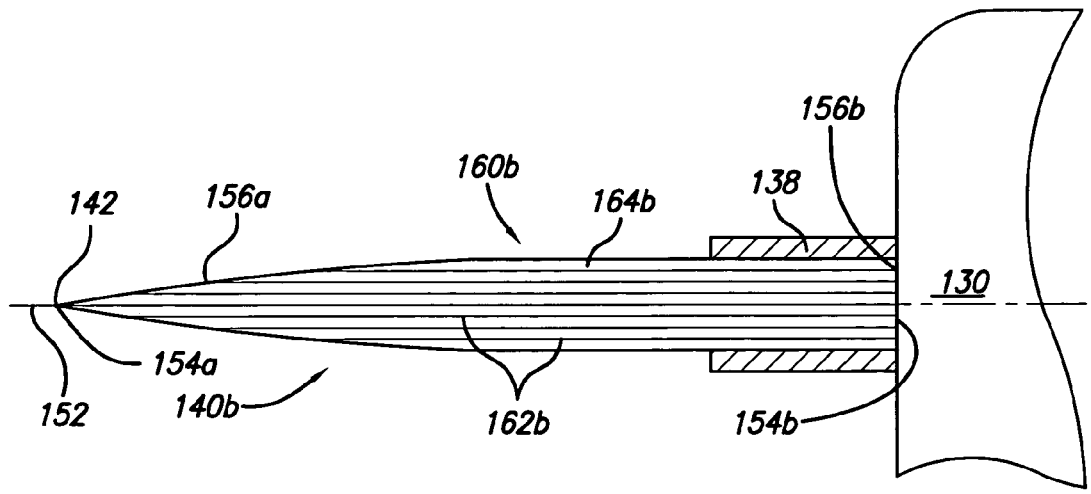
FIG. 8 is a cross sectional top view of a second exemplary resistive test probe tip of the present invention in a connection mechanism of a probing head, the resistive test probe tip having longitudinal resistive/conductive members dispersed evenly within encapsulating material.

FIGS. 7 and 8 show exemplary embodiments of the resistive test probe tip 140a (FIG. 7) and 140b (FIG. 8) of the present invention in which the resistive material 160a, 160b have a plurality of longitudinally extending resistive/conductive members (resistive conducting material) 162a, 162b surrounded by encapsulating material 164a, 164b. In FIG. 7, the longitudinally extending resistive/conductive members 162a are dispersed unevenly within the encapsulating material 164a. In FIG. 8, the longitudinally extending resistive/conductive members 162b are dispersed evenly within the encapsulating material 164b. In these embodiments, the resistive material 160 may be, for example, pultruded rod (e.g. Carbon X produced by Xerox Corporation). In one preferred embodiment, the resistive material 160 is formed using a pultrusion method such as those described in the Swift reference. The Swift reference also describes exemplary materials that could be used to implement the present invention. Each longitudinally extending resistive/conductive member has a first resistive/conductive member end 156a and a second resistive/conductive member end 156b. The first resistive/conductive member end 156a is at the probing end 154a and the second resistive/conductive member end 156b is at the connection end 154b.

In FIGS. 7 and 8 the at least one longitudinally extending resistive/conductive member 162 may be resistive/conductive fiber elements. Preferably the at least one longitudinally extending resistive/conductive member 162 is hundreds or thousands of resistive/conductive fiber elements with ends exposed so as to provide electronic contacts at both ends of each resistive/conductive fiber element. The fiber loading in the encapsulating material 164 depends upon the conductivity desired and the cross sectional area of the resistive material 160. To increase the conductivity, additional resistive/conductive fiber may be added. A high degree of redundancy and availability of electrical contact points enables a substantial improvement in reliability. Since the plurality of resistive/conductive members 162 are pulled as a continuous length, the resulting resistive material 160 is formed with the resistive/conductive members 162 being continuous from one end of the resistive material 160 to the other and oriented within the encapsulating material 164 in a direction substantially parallel to the axial direction of the member. The term "axial direction" is intended to be construed as in a substantially lengthwise or longitudinal direction or along the major axis. Accordingly, the resistive material 160 may be formed in a continuous length and cut to any suitable dimension providing at each end a very large number of electrical contact points, the electrical contact points being the ends of each of the individual resistive/conductive members 162.

FIG. 9 shows an alternative exemplary embodiment of the resistive test probe tip 140c of the present invention in which the resistive material 160c has a plurality of resistive/conductive members 162c (resistive conducting material) surrounded by encapsulating material 164c. In this embodiment, the resistive/conductive members 162c are particulate resistive/conductive members dispersed within encapsulating material. There should be sufficient resistive/conductive members 162c to form at least one path through the encapsulating material 164c from the probing end 154a to the connection end 154b. It should be noted that one alternative method that may be used to create the probe tip 140c is an injection molding process in which the encapsulating material 164c is impregnated with resistive/conductive members 162c (e.g. carbon dust). Recent advances in mini molding and laser forming make this process possible.

It should be noted that a probe tip of the present invention may be at least partially enclosed in a protective sleeve 170. For example, in FIG. 10 the probe tip is partially surrounded by a coated or plated sleeve 170. The sleeve 170 preferably has a low resistance. In one preferred embodiment, the sleeve 170 may be laser trimmed.

Any suitable resistive/conductive members 162 may be used in the practice of the present invention. Typically, the resistive/conductive members 162 are resistive/conductive fibers (e.g. carbon, carbon/graphite, nichrome, graphite) that may be nonmetallic and have a DC volume resistivity suitable for their intended purposes. A particularly preferred resistive/conductive member 162 that may be used are those resistive/conductive members 162 that are obtained from the controlled heat treatment processing to yield partial carbonization of the polyacrylonitrile (PAN) precursor fibers. The term "nonmetallic" is used to distinguish from conventional metal fibers that exhibit metallic conductivity having resistivities of the order of $1 \times 10^{-6}$ $\Omega$/cm and to define a class of fibers that are nonmetallic but can be treated in ways to approach or provide metal-like properties. Higher resistivity materials may be used if the impedance of an associated electronic circuit is sufficiently high.

Any suitable encapsulating material 164 may be employed in the practice of the present invention. The encapsulating material 164 may be insulating or conducting. If cross-directional electrical connection is desired along the edges of the pultrusion, a conducting polymer may be used. Conversely, if insulating properties are desired along the edges of the pultrusion, an insulating encapsulating material 164 may be used, or insulating fibers can be used in the outer periphery of the pultruded configuration and the conducting fibers can be configured to reside away from the edges. Typically, the encapsulating material 164 may be, for example, a polymer selected from the group of structural thermoplastic and thermosetting resins. Polyesters, epoxies, vinyl esters, polyetheretherketones, polyetherimides, polyethersulphones, polypropylene, and nylon are, in general, suitable materials with the polyesters being preferred due to their short cure time and relative chemical inertness. If an elastomeric matrix is desired, a silicone, fluorosilicone, or polyurethane elastomer may provide the polymer matrix.

FIGS. 12–15 will be used to explain one preferred method of determining the proper length of the probe tip 140 of the present invention. First, as shown in FIG. 12, a metal probe tip can be modeled as a distributed circuit or transmission line with inductance and capacitance per unit length. The frequency response of the circuit shown in FIG. 12 would be approximately the trace shown in FIG. 13. The increase in signal amplitude is undesirable as the ideal frequency response would have a trace that was substantially flat. If the probe tip 140 were made of resistive material 160, then the equivalent circuit would be the circuit of FIG. 14. If R is optimized, a substantially flat frequency response such as that shown in FIG. 15 could be achieved. Some simulations were performed to determine the optimum value of resistance. The resistance is proportional to the impedance of the transmission line ($\sqrt{L/C}$) as well as inversely proportional to the square root of the length. Based on the above considerations, an initial point at which the resistance could be set would follow the formula of $R_1 = 0.75 \times (\sqrt{L_1/(C_1 \times \text{Length})})$. In this equation, $R_1$, $L_1$, and $C_1$ are resistance, inductance, and capacitance per millimeter. Length is the tip length in millimeters, 0.75 is the proportional constant. For example if the tip is 5 mm long, the inductance is 0.787 nH/mm, and the capacitance is 0.08 pF/mm, the equation above would yield $R_1$=33.3 Ω/mm. $R_1$ can also be adjusted to compensate for any capacitance at connection point $V_o$.

The resistive material 160 may be stamped or molded in the proper length or shape. Alternatively, the resistive material 160 maybe cut using methods (e.g. laser cutting) suitable to provide an extremely clean cut. A traditional grinding method would probably be unsuitable for providing a "clean" cut or "clean" shape as these methods would tend to leave the resistive/conductive members 162 exposed in a brush-like manner.

Although the present invention is shown with a traditional pointed tip, it should be noted that alternative shapes could be constructed. For exemplary purposes only, the present invention may have a tip shaped as the tips described in U.S. Pat. Nos. 6,809,535, 6,650,131, 6,518,780, D444,720, and D444,401. These patents are assigned to the assignee of the present invention and their specifications are incorporated herein by reference. The formation of these alternative tips may be done using methods described in the references themselves or by methods described herein.

It should be noted that the terms "encapsulating" and "enclosed" are meant to be used to describe the present invention. For example, the term "encapsulating" does not mean completely enclosed, as the encapsulating material would leave at least the ends of at least one of the resistive/conductive members exposed.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A test probe tip or contact comprising:
   (a) resistive material having a longitudinal axis, said resistive material comprising:
      (i) a plurality of longitudinally extending resistive/conductive members, at least one resistive/conductive member having a first resistive/conductive member end and a second resistive/conductive member end;
      (ii) encapsulating material enclosing said plurality of longitudinally extending resistive/conductive members which are dispersed throughout said encapsulating material; and
      (iii) said first resistive/conductive member end and said second resistive/conductive member end exposed from said encapsulating material to provide electrical contacts; and
   (b) said test probe tip constructed substantially from said resistive material, said test probe tip comprising:
      (i) a probing end at said first resistive/conductive member end, said probing end for probing electronic circuitry; and
      (ii) a connection end at said second resistive/conductive member end, said connection end for interfacing with a probing head.

2. The test probe tip of claim 1 wherein said resistive material is pultruded resistive material.

3. The test probe tip of claim 1 wherein said encapsulating material is nonconductive encapsulating material.

4. The test probe tip of claim 1 wherein said resistive material is pultruded rod.

5. The test probe tip of claim 1 wherein said test probe tip is constructed entirely of said resistive material.

6. The test probe tip of claim 1 wherein said plurality of longitudinally extending resistive/conductive members are conductive fiber elements.

7. The test probe tip of claim 1 wherein said resistive/conductive members is nonmetallic.

8. A probing system comprising:
   (a) a probing head having a connection mechanism;
   (b) a test probe tip constructed substantially from resistive material;
   (c) said resistive material having a longitudinal axis, said resistive material comprising:
      (i) a plurality of longitudinally extending resistive/conductive members, at least one resistive/conductive member having a first resistive/conductive member end and a second resistive/conductive member end;
      (ii) encapsulating material enclosing said plurality of longitudinally extending resistive/conductive members which are dispersed throughout said encapsulating material; and
      (iii) said first resistive/conductive member end and said second resistive/conductive member end exposed from said encapsulating material to provide electrical contacts; and
   (d) said test probe tip comprising:
      (i) a probing end at said first resistive/conductive member end, said probing end for probing electronic circuitry; and
      (ii) a connection end at said second resistive/conductive member end, said connection end for interfacing with said connection mechanism of said probing head.

9. The test probe tip of claim 8 wherein said test probe tip is constructed entirely of said resistive material.

10. The test probe tip of claim 8 wherein said plurality of longitudinally extending resistive/conductive members are nonmetallic.

11. A test probe tip or contact comprising:
   (a) resistive material comprising:
      (i) resistive conducting material;
      (ii) encapsulating material; and
      (iii) said encapsulating material substantially enclosing said resistive conducting material such that said resistive conducting material is dispersed throughout said encapsulating material;
   (b) said test probe tip constructed substantially from said resistive material, said test probe tip comprising:
      (i) a probing end for probing electronic circuitry; and
      (ii) a connection end for interfacing with a probing head; and
   (c) said resistive conducting material forming at least one path through said encapsulating material from said probing end to said connection end.

12. The test probe tip or contact of claim 11 wherein said resistive conducting material is a plurality of longitudinally extending resistive/conductive members.

13. The test probe tip or contact of claim 11 wherein said resistive conducting material is a plurality of conductive fiber elements.

14. The test probe tip or contact of claim 11 wherein said resistive material is formed by pultrusion.

15. The test probe tip or contact of claim 11 wherein said resistive material is formed by molding.

16. The test probe tip or contact of claim 11 wherein said resistive conducting material is selected from the group consisting of:
 (a) carbon;
 (b) carbon/graphite;
 (c) nichrome; and
 (d) graphite.

17. The test probe tip or contact of claim 11 wherein said encapsulating material is selected from the group consisting of:
 (a) a polymer;
 (b) structural thermoplastic;
 (c) thermosetting resins;
 (d) polyesters;
 (e) epoxies;
 (f) vinyl esters;
 (g) polyetheretherketones;
 (h) polyetherimides;
  (i) polyethersulphones;
 (j) polypropylene;
 (k) nylon;
 (l) an elastomeric matrix;
 (m) a silicone;
 (n) fluorosilicone; and
 (o) polyurethane elastomer.

18. The test probe tip or contact of claim 11 wherein said resistive conducting material is a plurality of particulate resistive/conductive members.

19. The test probe tip or contact of claim 11 wherein said resistive conducting material is nonmetallic.

20. A probing system comprising:
 (a) a probing head having at least one connection mechanism;
 (b) a test probe tip constructed substantially from resistive material, said test probe tip comprising:
  (i) a probing end for probing electronic circuitry; and
  (ii) a connection end for interfacing with a probing head;
 (c) said resistive material comprising:
  (i) resistive conducting material;
  (ii) encapsulating material;
  (iii) said resistive conducting material forming at least one path through said encapsulating material from said probing end to said connection end; and
  (iv) said encapsulating material substantially enclosing said resistive conducting material such that said resistive conducting material is dispersed throughout said encapsulating material.

21. The probing system of claim 20 wherein said resistive conducting material is a plurality of longitudinally extending resistive/conductive members.

22. The probing system of claim 20 wherein said resistive conducting material is a plurality of conductive fiber elements.

23. The probing system of claim 20 wherein said resistive material is formed by pultrusion.

24. The probing system of claim 20 wherein said resistive material is formed by molding.

25. The probing system of claim 20 wherein said resistive conducting material is selected from the group consisting of:
 (a) carbon;
 (b) carbon/graphite;
 (c) nichrome; and
 (d) graphite.

26. The probing system of claim 20 wherein said encapsulating material is selected from the group consisting of:
 (a) a polymer;
 (b) structural thermoplastic;
 (c) thermosetting resins;
 (d) polyesters;
 (e) epoxies;
 (f) vinyl esters;
 (g) polyetheretherketones;
 (h) polyetherimides;
 (i) polyethersulphones;
 (j) polypropylene;
 (k) nylon;
 (l) an elastomeric matrix;
 (m) a silicone;
 (n) fluorosilicone; and
 (o) polyurethane elastomer.

27. The probing system of claim 20 wherein said resistive conducting material is nonmetallic.

28. A test probe tip or contact comprising:
 (a) pultruded resistive material having a longitudinal axis, said pultruded resistive material comprising:
  (i) a plurality of longitudinally extending resistive/conductive members, at least one resistive/conductive member having a first resistive/conductive member end and a second resistive/conductive member end;
  (ii) nonconductive encapsulating material enclosing said plurality of longitudinally extending resistive/conductive members which are dispersed throughout said encapsulating material; and
  (iii) said first resistive/conductive member end and said second resistive/conductive member end exposed from said nonconductive encapsulating material to provide electrical contacts;
 (b) said test probe tip constructed entirely from said pultruded resistive material, said test probe tip comprising:
  (i) a probing end at said first resistive/conductive member end, said probing end for probing electronic circuitry; and
  (ii) a connection end at said second resistive/conductive member end, said connection end for interfacing with a probing head.

29. The test probe tip or contact of claim 28 wherein said plurality of longitudinally extending resistive/conductive members are nonmetallic.

* * * * *